United States Patent [19]
Kim

[11] Patent Number: 6,140,881
[45] Date of Patent: Oct. 31, 2000

[54] DISPLAY APPARATUS WITH A CIRCUIT FOR CONTROLLING THE INPUT VOLTAGE OF PLL ACCORDING TO DISPLAY MODE AND METHOD

[75] Inventor: Min-Soo Kim, Seoul, Rep. of Korea

[73] Assignee: SamSung Electronics Co., Ltd., Suwon, Rep. of Korea

[21] Appl. No.: 09/222,668

[22] Filed: Dec. 29, 1998

[30] Foreign Application Priority Data

Dec. 30, 1997 [KR] Rep. of Korea ................. 97-43907

[51] Int. Cl.$^7$ ................. H03L 7/08; H03L 7/06; H03L 7/00
[52] U.S. Cl. ................. 331/20; 331/17; 331/25; 327/156; 327/157; 348/540
[58] Field of Search ................. 331/4, 8, 10, 14, 331/16, 17, 20, DIG. 2, 25; 327/142, 143, 156–159; 348/540

[56] References Cited

U.S. PATENT DOCUMENTS

| | | |
|---|---|---|
| 4,988,955 | 1/1991 | Horie . |
| 5,151,665 | 9/1992 | Wentzler . |
| 5,304,956 | 4/1994 | Egan ................. 331/10 |
| 5,459,755 | 10/1995 | Iga et al. . |
| 5,534,821 | 7/1996 | Akiyama et al. . |

*Primary Examiner*—David Mis
*Attorney, Agent, or Firm*—Robert E. Bushnell, Esq.

[57] ABSTRACT

A display apparatus for selecting a display mode, based on the horizontal and vertical synchronizing signals and an analog video signal supplied from a host with multiple display modes, includes a mode distinction circuit for generating first to third control signals according to a display mode received from the host, a clock signal generator for generating a pixel clock signal corresponding to the display mode in response to the first and second control signals and the horizontal synchronizing signal, a voltage controller for generating adjustment signals applied to the clock signal generator to adjust the phase and frequency of the pixel clock signal according to first/second voltages and the first/second control signals, and a switching circuit for supplying or cutting off the second control signal to the clock signal generator according to the third control signal being at a first level or a second level in response to the first voltage and the third control signal. The first and second control signals are respectively to adjust the phase and frequency of the pixel clock signal according to the display mode. The mode distinction circuit generates the third control signal at the second level upon generating the first control signal, and generates the third control signal at the first level upon generating the second control signal.

13 Claims, 3 Drawing Sheets

DISPLAY APPARATUS WITH A CIRCUIT FOR CONTROLLING THE INPUT VOLTAGE OF PLL ACCORDING TO DISPLAY MODE AND METHOD

CLAIM OF PRIORITY

This application makes reference to, incorporates the same herein, and claims all benefits accruing under 35 U.S.C. §119 from an application entitled Display Apparatus with a Circuit for Controlling the Input Voltage of PLL According to Display Mode earlier filed in the Korean Industrial Property Office on Dec. 30, 1997, and there duly assigned Serial No. 97-43907 by that Office.

BACKGROUND OF THE INVENTION

1. Field of the Invention

The present invention relates to a display apparatus, which includes a voltage control circuit to transfer the coarse and fine signals from a microcomputer to a PLL (phase-locked loop) circuit to adjust the pixel clock signal for a display apparatus.

2. Description of the Related Art

A display apparatus with multiple display modes includes a microcomputer to select a display mode based on the horizontal and vertical synchronizing signals and the analog video signal received from a host. The PLL circuit includes a phase detector, low pass filter, charge pump circuit, voltage-controlled oscillator and frequency divider, to generate the pixel clock signal under the control of the microcomputer. The microcomputer controls the pixel clock signal to adjust the phase and frequency of the clock signal supplied from the PLL circuit to the analog to digital (A/D) converter according to the selected display mode. The A/D converter samples the analog clock signal corresponding to the display mode in response to the pixel clock signal of the PLL circuit.

A display apparatus exemplary of the related art includes a microcomputer, a PLL circuit and a voltage control circuit connected therebetween to select a display mode according to the horizontal and vertical synchronizing signals and the video signal received from the host. The microcomputer generates the control signals Coarse and Fine to control the pixel clock signal D_clk of the PLL circuit according to the display mode. Namely, the microcomputer generates the coarse control signal Coarse to adjust the phase of the sampling clock signal of the A/D converter and the fine control signal Fine to delay the phase of the sampling clock signal according to the display mode.

However, when the coarse control signal Coarse is generated with the source voltage of the fine control signal being applied to the PLL circuit, the charge pump circuit of the PLL is stimulated so as to alter the dividing number of the frequency divider of the PLL circuit over the locking range to stop the loop feedback, since the voltage of the fine control signal Fine is greater than that of the coarse control signal Coarse. This can result in destruction of the integrated circuit (IC) of the PLL circuit or malfunction of the display apparatus.

U.S. Pat. No. 4,988,955 entitled Phase-locked Loop Apparatus, to Horie discloses a clock signal having a predetermined frequency output from a clock generator and a signal output from a voltage controlled oscillator (VCO) and supplied through a frequency divider which are supplied to a phase detector. An output from the phase detector is supplied to a loop filter. The loop filter supplies a voltage in accordance with an output from the phase detector to a first control voltage terminal of the VCO and to a phase lock-in circuit. The phase lock-in circuit supplies a voltage in accordance with an output voltage from a loop filter to a second control voltage terminal of the VCO. In the VCO, the sensitivity of the first control voltage terminal is lower than that of the second control voltage terminal, i.e., a rate of change in output frequency with respect to a change in second control voltage is higher than that of the first control voltage. A phase lock detector for detecting whether or not the PLL apparatus is set in a phase-locked state is also connected to the phase lock-in circuit. When the phase lock detector detects a phase-locked state, a trigger signal is supplied to a power turn off circuit that turns off a power source Vi. The power source Vi is connected to the clock generator, the phase detector, a part of the phase lock-in circuit, the phase lock detector, and the frequency divider. Also, power is always supplied from a power source Vc to the remaining circuit of the phase lock-in circuit.

U.S. Pat. No. 5,151,665 entitled Phase-Lock-Loop System with Variable Bandwidth and Charge Pump Parameters, to Wentzler discloses a phase lock loop frequency synthesizer capable of handling both analog and digital transmission. The synthesizer includes a reference signal source, a phase detector coupled to the reference signal source, a phase lock loop filter coupled to the phase detector, and a voltage controlled oscillator coupled to the phase lock loop filter for providing an output and a feedback signal to the phase detector. The phase lock loop filter includes a charge pump coupled to the phase detector for providing a phase lock signal to a charge pump output node, the phase lock signal being variable in response to a bandwidth control signal, and a filter coupled to the charge pump for filtering the phase lock signal at a given bandwidth, the bandwidth being variable in response to the bandwidth control signal.

U.S. Pat. No. 5,459,755 entitled PLL Circuit, to Iga et al. discloses a PLL circuit wherein a delay circuit of a phase comparator receives a supply current from a first variable current source and changes a delay time in negative correlation with the amount of the supply current, and the first variable current source changes the amount of the supply current to the delay circuit in accordance with the indication of a control signal serving as a supply current control signal for a second variable current source and a third variable current source of a charge pump circuit. Changes in the delay time of the delay device of the phase comparing device are adapted such that the delay time changes as the amount of current of the phase comparison voltage signal of the charge pump circuit changes, permitting reduction in lock-up time.

U.S. Pat. No. 5,534,821 entitled Charge Pump Circuits for PLL Frequency Synthesizer, to Akiyama et al. discloses a PLL frequency synthesizer, which includes a voltage controlled oscillator, and a comparison frequency divider for dividing a frequency of the output signal from the voltage controlled oscillator to output a comparison signal. A phase comparator in the synthesizer compares a phase of a reference signal to be fed thereto with a phase of the comparison signal, and generates first and second phase difference signals, based on the compared result. The synthesizer further includes a charge-pump circuit that is operated based on the first and second phase difference signals, and has an output terminal connected to the voltage controlled oscillator. The charge-pump circuit includes a first bipolar transistor connected between a high-potential power supply and the output terminal, and a second bipolar transistor connected between a low-potential power supply and the output terminal. The first and second bipolar transistors are controlled based on the first and second phase difference signals, respectively. At least one of the first and second bipolar transistors is an emitter-follower type. In another embodiment, a node is provided between two switches formed by CMOS transistors, to serve as an output terminal of the charge-pump circuit. In a further embodiment, two PMOS transistors are provided as switches, and a node is provided therebetween to serve as an output terminal of the charge-pump circuit.

SUMMARY OF THE INVENTION

It is an object of the present invention to provide a display apparatus with means for cutting off the control signal to adjust the phase of the sampling clock signal from the charge pump circuit of the PLL circuit when adjusting the frequency of the sampling clock signal.

It is another object of the present invention to provide a display apparatus with means for preventing destruction the IC of the PLL circuit or a malfunction thereof.

According to an embodiment of the present invention, a display apparatus for selecting a display mode based on the horizontal and vertical synchronizing signals and an analog video signal supplied from a host with multiple display modes, includes a mode distinction circuit for generating first, second and third control signals according to a display mode received from the host, a clock signal generator for generating a pixel clock signal corresponding to the display mode in response to the first control signal and the second control signal and horizontal synchronizing signal, a voltage controller for generating adjustment signals applied to the clock signal generator to adjust the phase and frequency of the pixel clock signal according to a first voltage and a second voltage and the first control signal and the second control signal, and a switching circuit for selectively supplying and cutting off the second control signal to the clock signal generator when the third control signal is respectively at a first level and a second level in response to the first voltage and third control signal. The first and second control signals are respectively to adjust the phase and frequency of the pixel clock signal according to the display mode. The first and second voltages are respectively 12V and 5V of direct current (DC) voltage, for example. The mode distinction circuit generates the third control signal at the second level upon generating the first control signal, and the third control signal at the first level upon generating the second control signal.

Preferably, the voltage controller further includes a first voltage control circuit for generating a first adjustment signal to adjust the phase of the pixel clock signal in response to the first control signal, and a second voltage control circuit for generating a second adjustment signal to adjust the frequency of the pixel clock signal in response to the second control signal. The second voltage control circuit preferably includes a first resistor having one end connected to receive the second voltage and the other end connected to receive the second control signal from the mode distinction circuit, a second resistor having one end connected with the other end of the first resistor, a first inductor having one end connected with the other end of the second resistor, a third resistor having one end connected with the other end of the first inductor and the other end connected with the clock signal generator, a first capacitor having one end connected with the other end of the third resistor and the other end grounded, and a zener diode having the cathode connected with the one end of the first capacitor and the anode grounded. In addition, the switching circuit comprises a fourth resistor having one end connected to receive the first voltage and the other end connected to receive the third control signal from the mode distinction circuit, a fifth resistor having one end connected with the other end of the fourth resistor and the other end connected with one end of a second inductor, a second capacitor having one end connected with the other end of the second inductor and the other end grounded, and an NMOS transistor having the drain connected with the cathode of the zener diode, the gate connected with the one end of the second capacitor and the source grounded.

BRIEF DESCRIPTION OF THE ATTACHED DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENTS

Figure 1:
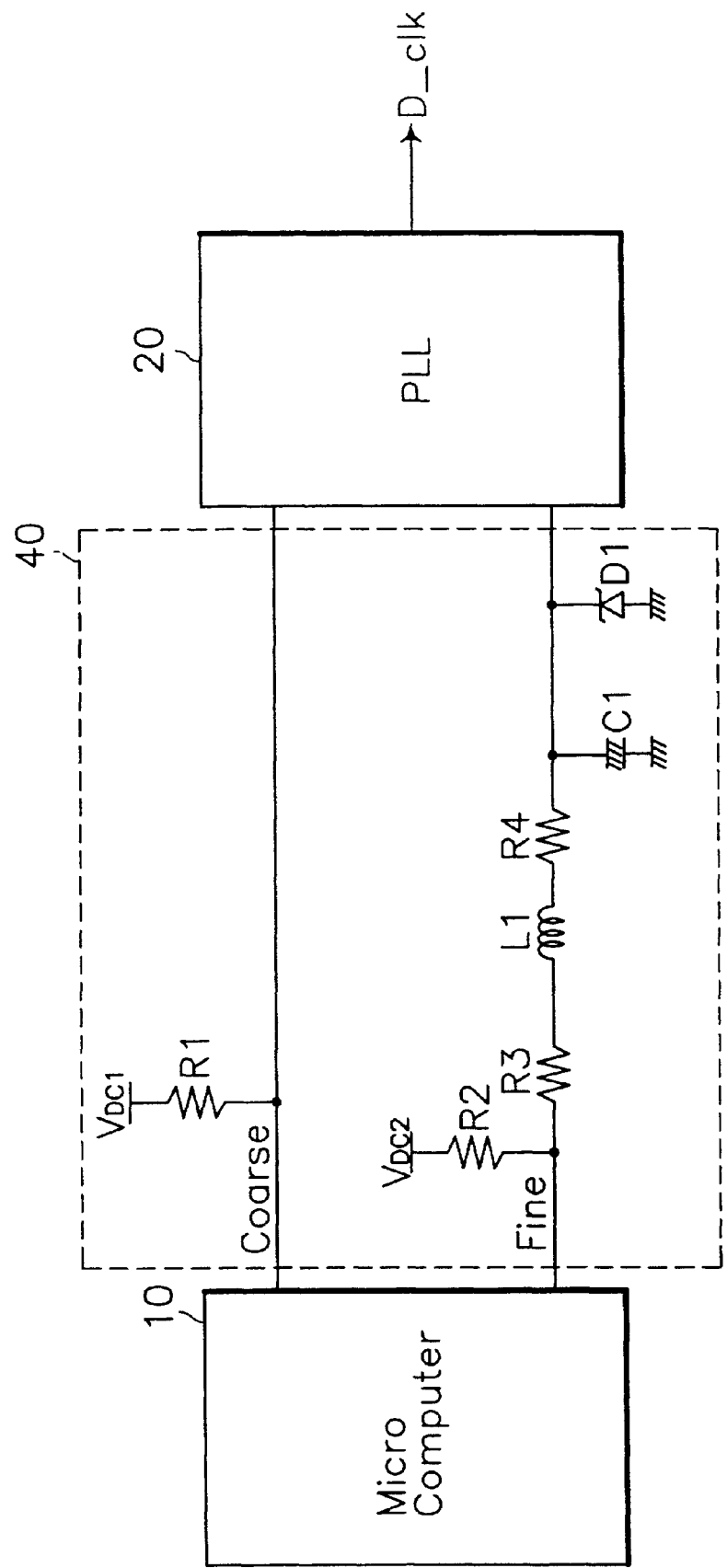
FIG. 1 is a circuit diagram for illustrating the connection between the microcomputer and a PLL circuit of a display apparatus exemplary of the related art.

Referring to FIG. 1, the display apparatus exemplary of the related art includes a microcomputer 10, a PLL circuit 20 and a voltage control circuit 40 connected therebetween to select a display mode according to the horizontal and vertical synchronizing signals and the video signal received from the host (not shown). The microcomputer 10 generates the control signals Coarse and Fine to control the pixel clock signal D_clk of the PLL circuit 20 according to the determined display mode. Namely, the microcomputer 10 generates the coarse control signal Coarse to adjust the phase of the sampling clock signal of the A/D converter (not shown) and the fine control signal Fine to delay the phase of the sampling clock signal according to the display mode.

Figure 2:
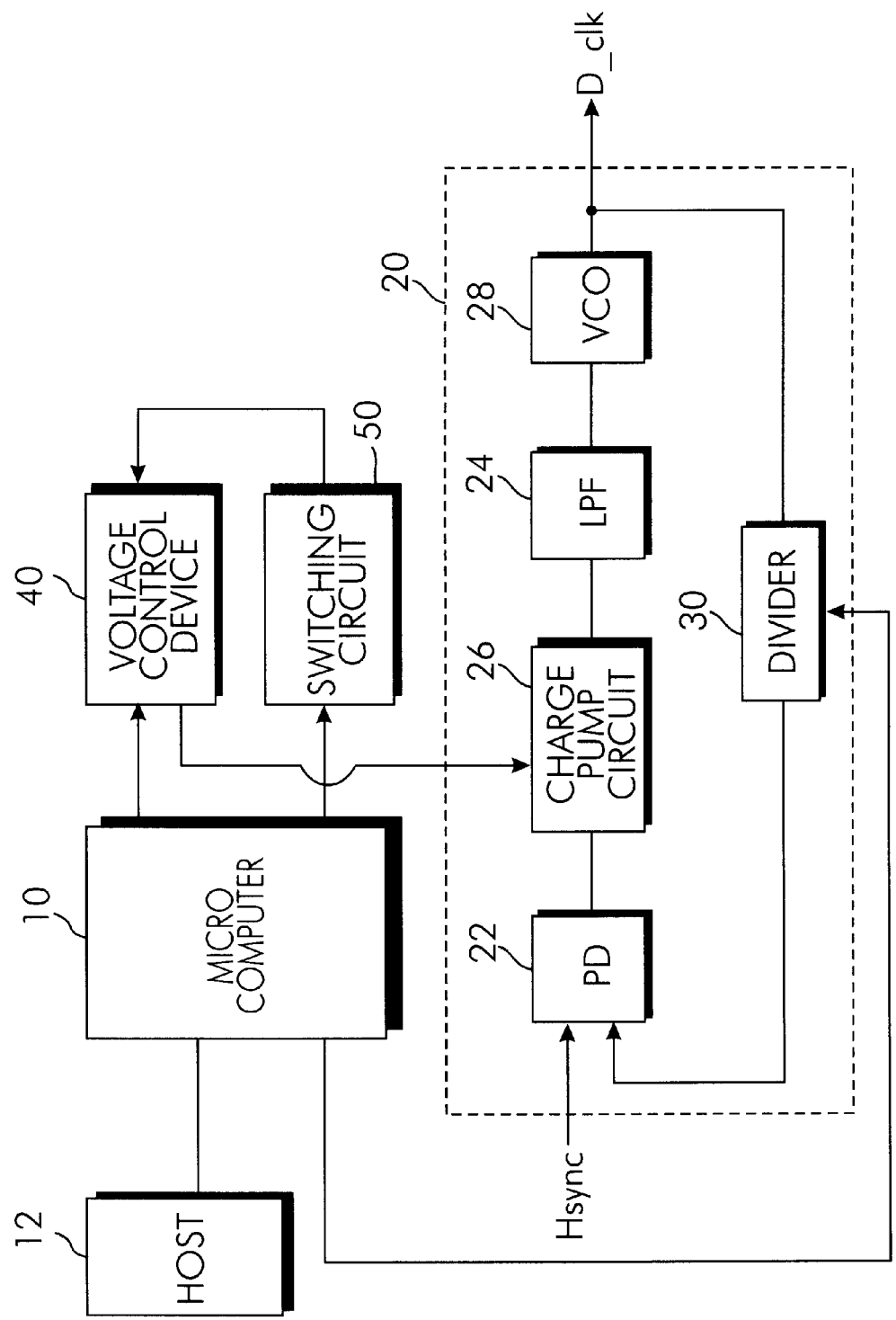
FIG. 2 is a block diagram for illustrating the connection between the microcomputer and a PLL circuit of a display apparatus according to the present invention.
Figure 3:
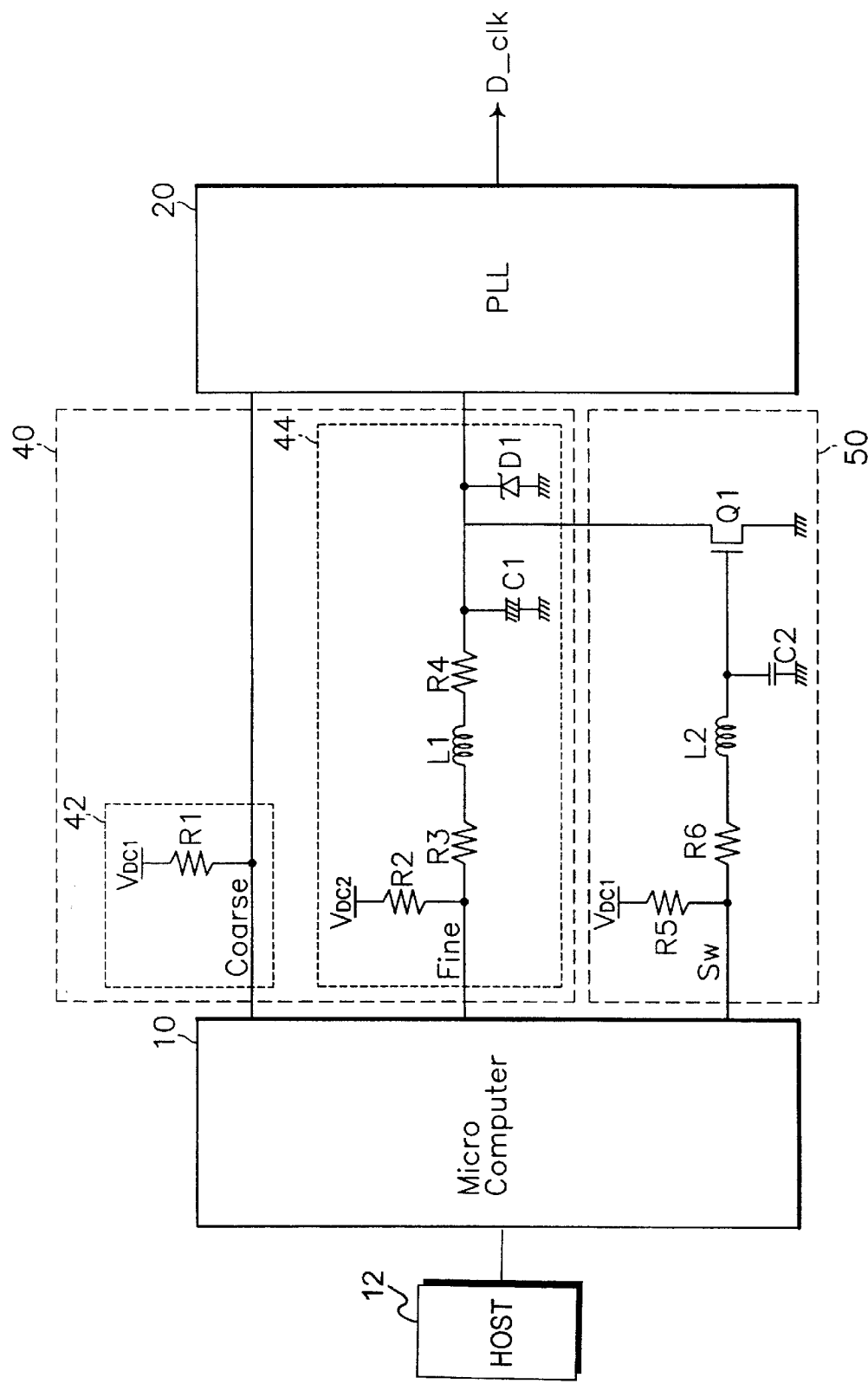
FIG. 3 is a circuit diagram for illustrating a circuit to control the charge pump of a display apparatus according to the present invention.

Referring to FIGS. 2 and 3, FIGS. 2 and 3 illustrate a voltage control device 40 and a switching circuit 50 between a microcomputer 10 and phase-locked loop (PLL) circuit 20 according to the present invention. The microcomputer 10 distinguishes, or determines, a display mode based on the horizontal and vertical synchronizing signals and at least an analog video signal, such as a red, green, or blue signal (RGB signal) supplied by a host 12 connected with the display apparatus. Further, the microcomputer 10 generates coarse and fine control signals Coarse and Fine to adjust the phase and the frequency of the pixel clock signal D_clk generated from the PLL circuit 20 according to the distinguished or determined display mode. The microcomputer 10 also generates a switching control signal Sw to cut off the fine control signal upon generating the coarse control signal. The PLL circuit 20 includes a phase detector (PD) 22, a filter (LPF) 24, a charge pump circuit 26, a voltage controlled oscillator (VCO) 28 and a frequency divider 30, as shown in FIG. 2. The microcomputer 10 controls the frequency divider 30 of the PLL circuit 20 to generate the pixel clock signal D_clk for an A/D converter (not shown) to sample an analog clock signal according to the display mode.

Referring to FIGS. 2 and 3, the PLL circuit 20 generates the pixel clock signal D_clk corresponding to the display mode in response to the coarse and fine control signals Coarse and Fine and the horizontal synchronizing signal Hsync. Meanwhile, the frequency divider 30 determines the dividing number according to the display mode distinguished, or determined, by the microcomputer 10, and feeds it back in the loop in PLL circuit 20. The voltage control device 40 supplies a suitable voltage to the charge pump circuit 26 of the PLL circuit 20 based on the coarse and fine control signals Coarse and Fine according to the display mode. When the coarse control signal Coarse is applied to the PLL circuit 20, the switching circuit 50 operates to cut off the fine control signal Fine by grounding.

Referring to FIGS. 2 and 3, the voltage control device 40 includes a first voltage control circuit 42 for generating a first adjustment signal to adjust the phase of the pixel clock signal D_clk in response to the coarse control signal and includes a second voltage circuit 44 for generating a second adjustment signal to adjust the frequency of the pixel clock signal D_clk in response to the fine control signal. The second voltage control circuit 44 includes a first resistor R2 having one end connected to receive the second voltage $V_{DC2}$ and the other end connected to receive the fine control signal Fine from the microcomputer 10, a second resistor R3 having one end connected with the other end of the first resistor R2 and the other end connected with one end of a first inductor L1, a third resistor R4 having one end connected with the other end of the first inductor L1 and the other end connected with the PLL circuit 20, a first capacitor C1 having one end connected with the other end of the third resistor R4 and the other end grounded, and a zener diode D1 having the cathode connected with the one end of the first capacitor and the anode grounded. The first inductor L1, third resistor R4 and first capacitor C1 serve as a smoothing circuit.

In addition, the switching circuit 50 includes a fourth resistor R5 having one end connected to receive the first voltage $V_{DC1}$ and the other end connected to receive the switching control signal Sw from the microcomputer 10, a fifth resistor R6 having one end connected with the other end of the fourth resistor R5 and the other end connected with one end of a second inductor L2, a second capacitor C2 having one end connected with the other end of the second inductor L2 and the other end grounded, and an NMOS transistor Q1 having the drain connected with the cathode of the zener diode D1, the gate connected with the one end of the second capacitor C2 and the source grounded. The second inductor L2 and second capacitor C2 serve as a smoothing circuit.

In operation, when generating the coarse control signal, the microcomputer 10 applies the switching control signal Sw at a high level in order to cut off the high second voltage $V_{DC2}$ of the fine control signal. Namely, the switch control signal Sw is supplied through the smoothing circuit consisting of the second inductor L2 and the second capacitor C2 to the gate of the NMOS transistor Q1 to conduct grounding of the fine control signal Fine. Alternatively, when the voltage control device operates to deliver the fine control signal Fine to the PLL circuit 20, the switching control signal Sw is at a low level to cut off the NMOS transistor Q1.

While there have been illustrated and described what are considered to be preferred embodiments of the present invention, it will be understood by those skilled in the art that various changes and modifications may be made, and equivalents may be substituted for elements thereof without departing from the true scope of the present invention. In addition, many modification may be made to adapt a particular situation to the teaching of the present invention without departing from the scope thereof. Therefore, it is intended that the present invention not be limited to the particular embodiments disclosed as the best mode contemplated for carrying out the present invention, but that the present invention includes all embodiments falling within the scope of the appended claims.

What is claimed is:

1. A display apparatus, comprising:
    a mode distinction circuit for generating a first control signal, a second control signal and a third control signal according to a display mode received from a host, said first control signal is to adjust a phase of a pixel clock signal according to said display mode received from said host, and said second control signal is to adjust a frequency of said pixel clock signal according to said display mode received from said host, and said mode distinction circuit generating said third control signal at a first level upon generating said second control signal to adjust said frequency of said pixel clock signal, and said mode distinction circuit generating said third control signal at a second level upon generating said first control signal to adjust said phase of said pixel clock signal;
    a clock signal generator for generating said pixel clock signal corresponding to said display mode received from said host in response to said first control signal, said second control signal, and a horizontal synchronizing signal;
    a voltage controller for selectively generating adjustment signals applied to said clock signal generator to adjust a phase of said pixel clock signal according to said first control signal and to adjust a frequency of said pixel clock signal according to said second control signal; and
    a switching circuit for receiving said third control signal from said mode distinction circuit and for selectively permitting supplying and cutting off said second control signal to said clock signal generator according to said third control signal being respectively at one of said first level to permit supplying said second control signal to said clock signal generator and said second level to cut off said second control signal to said clock signal generator.

2. The display apparatus according to claim 1, further comprised of said first control signal is to adjust the phase of said pixel clock signal according to said display mode received from said host using a first voltage.

3. The display apparatus according to claim 1, further comprised of said second control signal is to adjust the frequency of said pixel clock signal according to said display mode received from said host using a second voltage.

4. The display apparatus according to claim 1, further comprised of said first control signal is to adjust the phase of said pixel clock signal according to said display mode received from said host using a first voltage, and said second control signal is to adjust the frequency of said pixel clock signal according to said display mode received from said host using a second voltage.

5. The display apparatus according to claim 4, further comprised of said voltage controller comprising:

a first voltage control circuit for generating a first adjustment signal to adjust the phase of said pixel clock signal in response to said first control signal; and a second voltage control circuit for generating a second adjustment signal to adjust the frequency of said pixel clock signal in response to said second control signal.

6. The display apparatus according to claim 5, further comprised of said second voltage control circuit comprising:

a first resistor having one end connected to receive said second voltage and the other end of said first resistor connected to receive said second control signal from said mode distinction circuit;

a second resistor having one end connected with said other end of said first resistor;

a first inductor having one end connected with the other end of said second resistor;

a third resistor having one end connected with the other end of said first inductor and the other end of said third resistor connected with said clock signal generator;

a first capacitor having one end connected with the other end of said third resistor and the other end of said first capacitor grounded; and a zener diode having a cathode connected with said one end of said first capacitor and an anode grounded.

7. The display apparatus according to claim 6, further comprised of said switching circuit comprising:

a fourth resistor having one end connected to receive said first voltage and the other end of said fourth resistor connected to receive said third control signal from said mode distinction circuit;

a fifth resistor having one end connected with the other end of said fourth resistor and the other end of said fifth resistor connected with one end of a second inductor;

a second capacitor having one end connected with the other end of said second inductor and the other end of said second capacitor grounded; and an NMOS transistor having a drain connected with said cathode of said zener diode, a gate connected with said one end of said second capacitor and a source grounded.

8. The display apparatus according to claim 1, further comprised of said mode distinction circuit comprising a microcomputer, and said clock signal generator comprising a phase-locked loop (PLL) circuit.

9. The display apparatus according to claim 1, further comprised of said display apparatus for selecting said display mode received from said host based on horizontal and vertical synchronizing signals and an analog video signal supplied from said host with multiple display modes.

10. A method for selecting a display mode for a display apparatus, comprising the steps of:

selectively generating a first control signal, a second control signal and a third control signal according to a display mode received from a host, said first control signal adjusting a phase of a pixel clock signal according to said display mode received from said host, said second control signal adjusting a frequency of said pixel clock signal according to said display mode received from said host, said third control signal being generated at a first level upon generating said second control signal to adjust said frequency of said pixel clock signal, and said third control signal being generated at a second level upon generating said first control signal to adjust said phase of said pixel clock signal;

generating said pixel clock signal corresponding to said display mode received from said host in response to said first control signal, said second control signal and a horizontal synchronizing signal;

generating selectively adjustment signals to adjust said phase of said pixel clock signal according to said first control signal and said frequency of said pixel clock signal according to said second control signal; and selectively permitting supplying and cutting off said second control signal according to said third control signal being at one of said first level to permit supplying said second control signal and said second level to cut off said second control signal.

11. The method according to claim 10, further comprising the steps of:

generating a first adjustment signal to adjust said phase of said pixel clock signal in response to said first control signal; and generating a second adjustment signal to adjust said frequency of said pixel clock signal in response to said second control signal.

12. The method according to claim 11, further comprising the steps of:

adjusting said phase of said pixel clock signal according to said display mode received from said host using a first voltage; and adjusting said frequency of said pixel clock signal according to said display mode received from said host using a second voltage.

13. The method according to claim 10, further comprising the steps of:

adjusting said phase of said pixel clock signal according to said display mode received from said host using a first voltage; and adjusting said frequency of said pixel clock signal according to said display mode received from said host using a second voltage.

* * * * *